(12) United States Patent
Madan

(10) Patent No.: US 6,414,359 B1
(45) Date of Patent: Jul. 2, 2002

(54) SIX TRANSISTOR SRAM CELL HAVING OFFSET P-CHANNEL AND N-CHANNEL TRANSISTORS

(75) Inventor: Sudhir Madan, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 08/733,586

(22) Filed: Oct. 18, 1996

Related U.S. Application Data

(60) Provisional application No. 60/005,609, filed on Oct. 19, 1995.

(51) Int. Cl.⁷ ................................................ H01L 27/11
(52) U.S. Cl. ....................... 257/369; 257/401; 257/903
(58) Field of Search ................................ 257/369, 401, 257/903

(56) References Cited

U.S. PATENT DOCUMENTS 4,132,904 A * 1/1979 Harari .......................... 257/369
5,072,286 A * 12/1991 Minami et al. ............. 257/903

* cited by examiner

*Primary Examiner*—Gene M. Munson
(74) *Attorney, Agent, or Firm*—Wade James Brady, III; Frederick J. Telecky, Jr.

(57) ABSTRACT

A 6T CMOS SRAM cell (100) that increases process margins for a given cell area The cell (100) comprises a pair of cross-coupled inverters (102, 104). Each inverter (102, 104) comprises a p-channel pull-up transistor (106, 108) and a n-channel pull-down transistor (110, 112). The p-channel pull-up transistors (106, 108) are offset in both the vertical and horizonal directions from the n-channel pull-down transistors (110, 112).

5 Claims, 4 Drawing Sheets

US 6,414,359 B1

SIX TRANSISTOR SRAM CELL HAVING OFFSET P-CHANNEL AND N-CHANNEL TRANSISTORS

This application claims benefit of Provisional Application No. 60/005,609 filed Oct. 19, 1995.

FIELD OF THE INVENTION

This invention generally relates to semiconductor devices and more specifically to SRAM cell designs.

BACKGROUND OF THE INVENTION

A schematic of a typical static random access memory (SRAM) cell is shown in FIG. 1A. SRAM cells typically comprise a pair of cross-coupled inverters (12, 14) to store a data bit state and a pair of pass transistors (16, 18) to read and write a data bit between the cross-coupled inverters (12, 14) and bitlines (30, 32). Each inverter (12, 14) comprises a p-channel pull-up transistor (20, 22) and a n-channel pull-down transistor (24, 26). This type of SRAM cell comprises 6 transistors and is termed a 6T full CMOS SRAM cell. When the channels of all the transistors are formed in the single crystal silicon substrate, it is called a single crystalline bulk CMOS 6T SRAM cell. It is also referred to as a planar SRAM cell when all the transistors are made in the same substrate material (e.g., bulk crystalline silicon, SOI, etc.). In order to improve the stability of the cell so as to improve data retention characteristics, the widths and lengths of the p-channel (20, 22) and n-channel (16, 18, 24, 26) transistors are matched for the two inverters (12, 14).

FIGS. 1B and 1C show layout diagrams of prior SRAM cells with low aspect ratios. Aspect ratio is defined as the ratio of length to width. The bitlines (70, 72) are shown in the y-direction. The cell measurement in the direction of the bitlines defines the length of the cell and the measurements in the x-direction defines the width of the cell. A ratio of less than 2:1 is considered low aspect ratio for an SRAM cell as opposed to a ratio of about 3:1 for long aspect ratio cells. In FIGS. 1B and 1C, the transistors 20–26 are formed using polysilicon lines 34 and 36 extending over p-type moat regions 42 and 44 for p-channel transistors 20 and 22 and extending over n-type moat regions 46 for the n-channel transistors 24 and 26. A transistor gate is defined as the region common to the polysilicon and moat regions of a transistor which forms the conduction channel between the source and drain when the transistor is turned on. The transistor gate for the transistors 20, 22, 24, and 26 is the common region between polysilicon line 34 and moat 42 (region 90), polysilicon line 36 and moat region 44 (region 92), polysilicon line 34 and moat region 46(region 94) and polysilicon region 36 and moat region 46 (region 96), respectively. The cross-coupling of the inverters 12 and 14 is accomplished using metal lines 38 and 40. In FIG. 1B, the gates of p-channel transistors 20 and 22 (regions 90 and 92) are vertically offset (offset in the y-direction) from gates of the n-channel transistors 24 and 26 (regions 94 and 96). The p-channel transistor gate 90 of inverter 12 is not horizontally offset (offset in the x-direction) from n-channel transistor gate 94 and p-channel transistor gate 92 is not horizontally offset from n-channel transistor gate 96. In FIG. 1C, the p-channel transistor gates 90 and 92 are also vertically offset from the n-channel transistor gates 94 and 96. In addition, p-channel transistor gate 90 is offset in a left or negative horizontal (x−) direction from n-channel transistor gate 94 and p-channel transistor gate 92 is offset in a right or positive horizontal (x+) direction from n-channel transistor gate 96.

Thus, the p-channel transistor gates 90 and 92 are offset from their respective n-channel transistor gates 94 and 96 is opposite directions.

The p-channel transistor gates 90 and 92 are placed at equal distance from and are on opposites sides of an imaginary vertical line drawn at the middle of the two n-channel transistor gates 94 and 96. In other words, if xn1,yn1 are the x,y co-ordinates for the center point of the n-channel pull-down transistor gate 94 for inverter 12; xn2,yn2 are the x,y co-ordinates for the center point of the n-channel pull-down transistor gate 96 for inverter 14; xp1,yp1 are the x,y co-ordinates for the center point of the p-channel pull-up transistor gate 90 for inverter 12; and xp2,yp2 are the x,y co-ordinates for the center point of the p-channel pull-up transistor gate 92 for inverter 14, then the mean (xnm) of the xn1 and xn2 values is equal to the mean (xpm) of xp1 and xp2. This is true even if the gate length of the p-channel transistors 20, 22 is different than the gate length of the n-channel transistors 24, 26.

In order to minimize cell area, process design rules, such as metal overlap, are sometimes violated. For example, the metal overlap of contact design rule is violated in FIGS. 1B and 1C at regions 80, 82, and 84. This, in turn reduces the process margins. As density and performance requirements increase it becomes more and more desirable to maximize process margins while minimizing cell area.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

The invention will be described in conjunction with a 6T CMOS SRAM device. Those skilled in the art will realize that the benefits of the SRAM cell of the invention may be utilized by various SRAM memories as well as gate arrays and other devices (e.g., microprocessors and microcontrollers having on-chip SRAM cache memory, etc.).

Figure 1A:
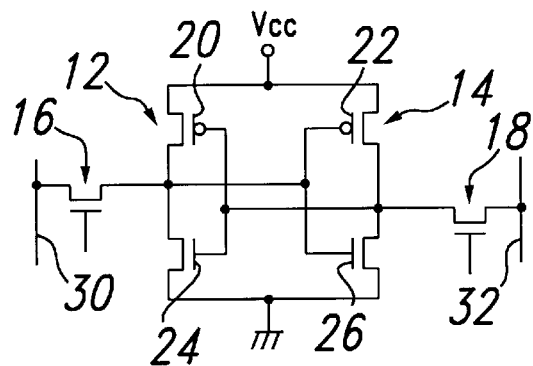
FIG. 1A is a schematic diagram of a conventional SRAM cell.
Figure 2:
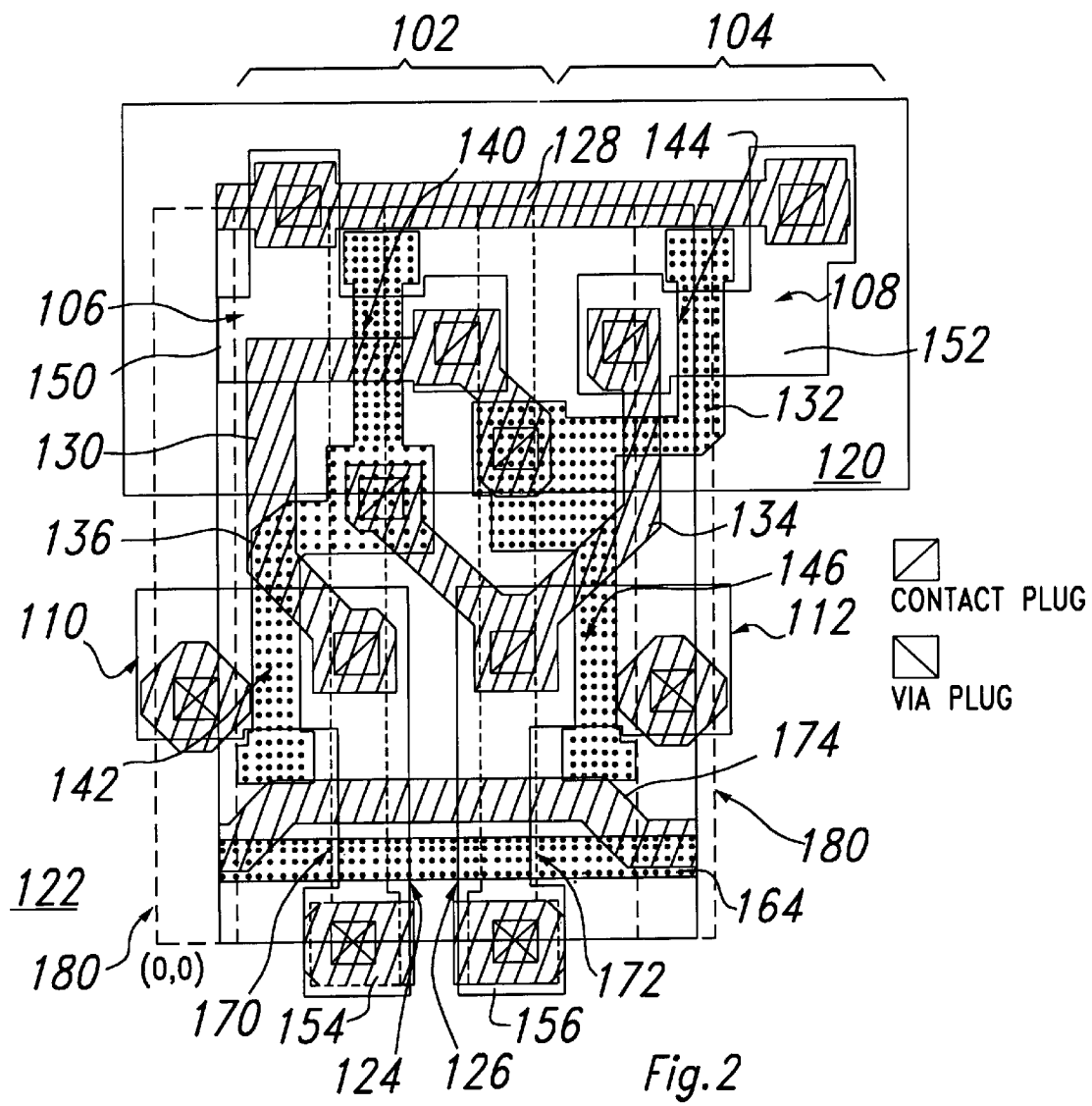
FIG. 2 is a layout diagram of a SRAM cell according to a first embodiment of the invention.

A 6T CMOS SRAM cell layout according to a first embodiment of the invention is shown in FIG. 2. The layout of FIG. 2 corresponds to the schematic diagram of FIG. 1A. P-channel transistors 106 and 108 are located within n-well 120 which is formed in the p-type substrate 122. N-channel transistors 110 and 112 are formed outside of n-well 120 in substrate 122. Pass transistors 124 and 126 are also located in substrate 122. Substrate 122 may comprise a bulk substrate, a silicon-on-insulator substrate, or an epitaxial layer formed on a semiconductor substrate, as will be apparent to those of ordinary skill in the art. If, in the alternative, a n-type substrate is used, the p-channel transistors 106 and 108 may be formed in the substrate and the n-channel transistors 110 and 112 as well as pass transistors 124 and 126 may be formed in a p-well (not shown). Those of ordinary skill in that art will realize that, with minor changes, pass transistors 124 and 126 and transistors 110 and 112 could alternatively be p-channel and transistors 106 and 108 could be n-channel.

P-channel transistors 106 and 108 are pull-up transistors and are connected to the supply voltage, Vcc 128. N-channel transistors 110 and 112 are connected between the respective p-channel transistor and ground 180. N-channel transistors 110 and 112 are thus pull-down transistors. P-channel transistor 106 and n-channel transistor 110 form inverter 102. P-channel transistor 108 and n-channel transistor 112 form inverter 104. Inverters 102 and 104 are connected in a cross-coupled fashion in that the output 130 of inverter 102 is connected to the input 132 of 104 and the output 134 of inverter 104 is connected to the input 136 of inverter 102.

The layout shown in FIG. 2 is a low aspect ratio layout. The aspect ratio is less than 2:1. The constraints for low aspect ratio cells differs from that of high aspect ratio cells. The invention applies to low aspect ratio cells. In the low aspect ratio layout of FIG. 2, the n-channel transistors 110 and 112 are roughly aligned laterally as is typical in a low aspect ratio layout. The p-channel transistors 106 and 108 are also roughly aligned laterally.

The transistor gate 140 of p-channel transistor 106 is offset both vertically and horizontally from the transistor gate 142 of n-channel transistor 110. The transistor gate 144 of p-channel transistor 108 is offset both vertically and horizontally from the transistor gate 146 of n-channel transistor 112. The p-channel transistor gates 140 and 144 are both offset in the same direction from the n-channel transistor gates 142 and 146, respectively. P-channel transistor gates 140 and 144 are offset to the right horizontally from n-channel transistor gates 142 and 146, respectively. Those skilled in the art will realize that they may alternatively be offset to the left horizontally. The amount of offset may differ between the inverters 102, 104. FIG. 2 shows a roughly similar offset, both vertically and horizontally, in each inverter 102, 104.

In contrast to prior art SRAM cells, the mean co-ordinate in the x-direction, xnm, of the n-channel transistor gates 142 and 146 is not equal to the mean co-ordinate in the x-direction, xpm, of the p-channel transistor gates 140, 144. That is, if the x-y co-ordinate of the center point of gate 142 is xn1,yn1, the x-y co-ordinate of the center point of gate 146 is xn2,yn2, the x-y co-ordinate of the center point of gate 140 is xp1,yp1, and the x-y co-ordinate of the center point of gate 144 is xp2,yp2, the mean (xnm=(xn1+xn2)/2) of the x co-ordinates of the n-channel transistors is not equal to the mean (xpm=(xp1+xp2)/2) of the x co-ordinates of the p-channel transistors. A difference between the p-channel mean xpm and the n-channel mean xnm may be in the range of the minimum feature size of a given technology (e.g., 0.5 microns) to one half of the cell width. For example, in FIG. 2, the cell width is 6.9 microns, xn1 is 0.80 microns, xn2 is 5.5 microns, xp1 is 2.4 microns and xp2 is 7.0 microns. Thus, xnm is 3.15 and xpm is 4.7 for a difference of 1.55 microns. The cell origin is marked as (0,0).

Process steps to fabricate the SRAM cell of FIG. 2 are conventional. Transistors 106–112, 124 and 126 are formed in moat regions 150, 152, 154, and 156. Polysilicon lines 132, 136 and 164 are used to form the gates of the various transistors 106–112, 124, and 126. The source/drain regions for transistor 106 is formed in moat region 150. Moat region 152 is used for the source/drain regions of transistor 108. Moat region 154 is used for the source/drain regions of transistors 110 and 124 and moat region 156 is used for the source/drain regions of transistors 112 and 126. The supply voltage Vcc 128 and intra-cell interconnects 130 and 134 are routed in the first layer of metal, METAL1, and contact plugs. Wordline 174 is also typically routed in metal and then through contacts to polysilicon 164 which forms the gates of the pass transistors 124 and 126. A subsequent layer of metal, METAL2, is used to route ground, Vss 180. The bitlines (170, 172) are also connected to the moat regions (154, 156) respectively thru via and contact plugs and METAL1. In some SRAMs, the wordline routing in metal is omitted and gate polysilicon is used for the wordline routing.

An advantage of the invention is that the cell area required to meet a set of design rules is reduced over prior art designs. Using 0.5 μm design rules, a cell area of 63 μm² can be obtained. A typical 0.5 μm design rule set includes the following: gate length of 0.5 μm, moat spacing of 1.0 μm, contact size of 0.6 μm, minimum metal line spacing of 0.6/0.8 μm, minimum moat width of 0.9 μm, and a metal overlap of contact of 0.24 μm. Offsetting the p-channel transistors 106 and 108 in the horizontal direction reduces the impact on cell area of metal overlap of contact design rule.

Figure 1B:
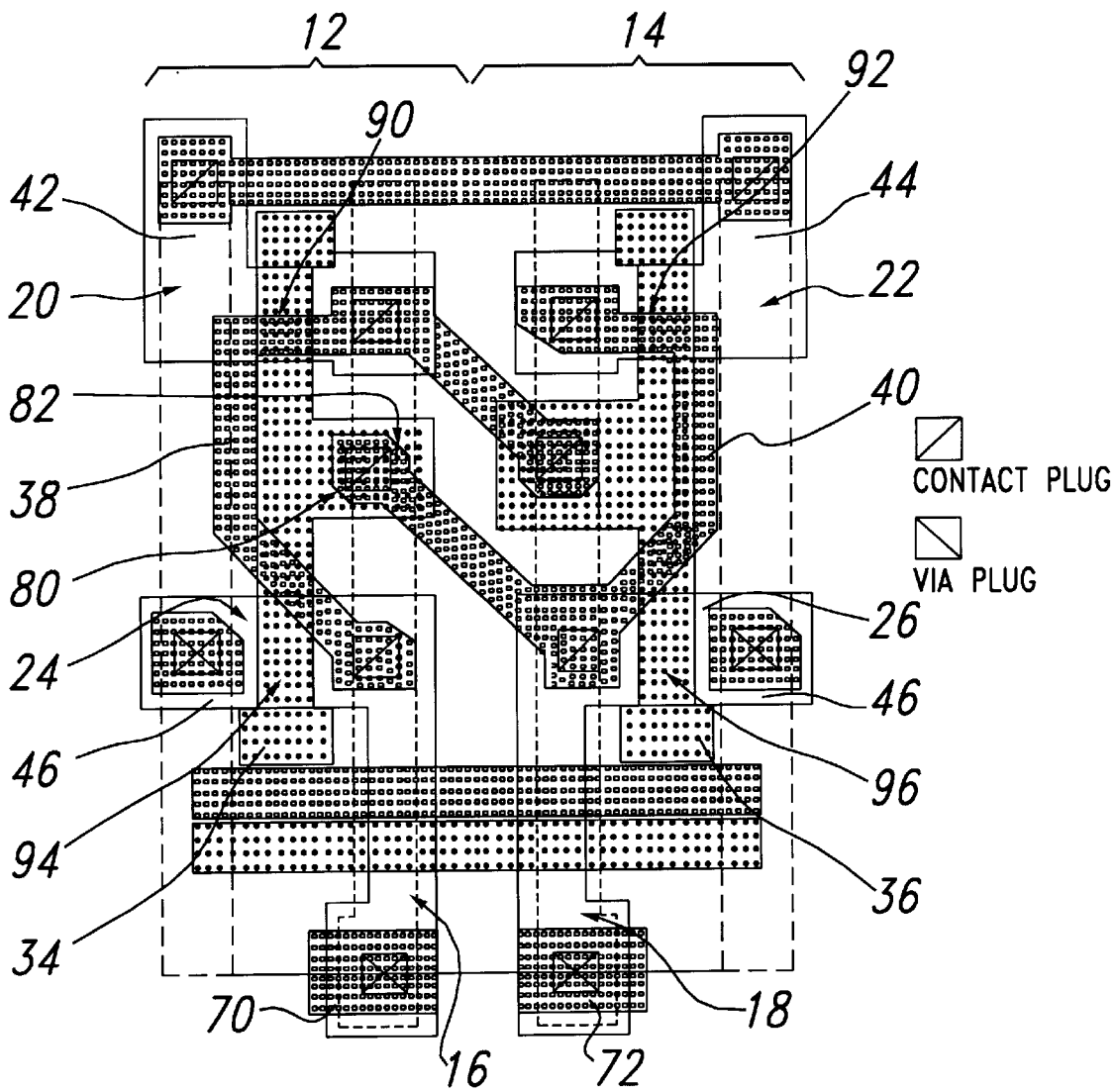
FIGS. 1B–C are layout diagrams of prior art SRAM cells.
Figure 1C:
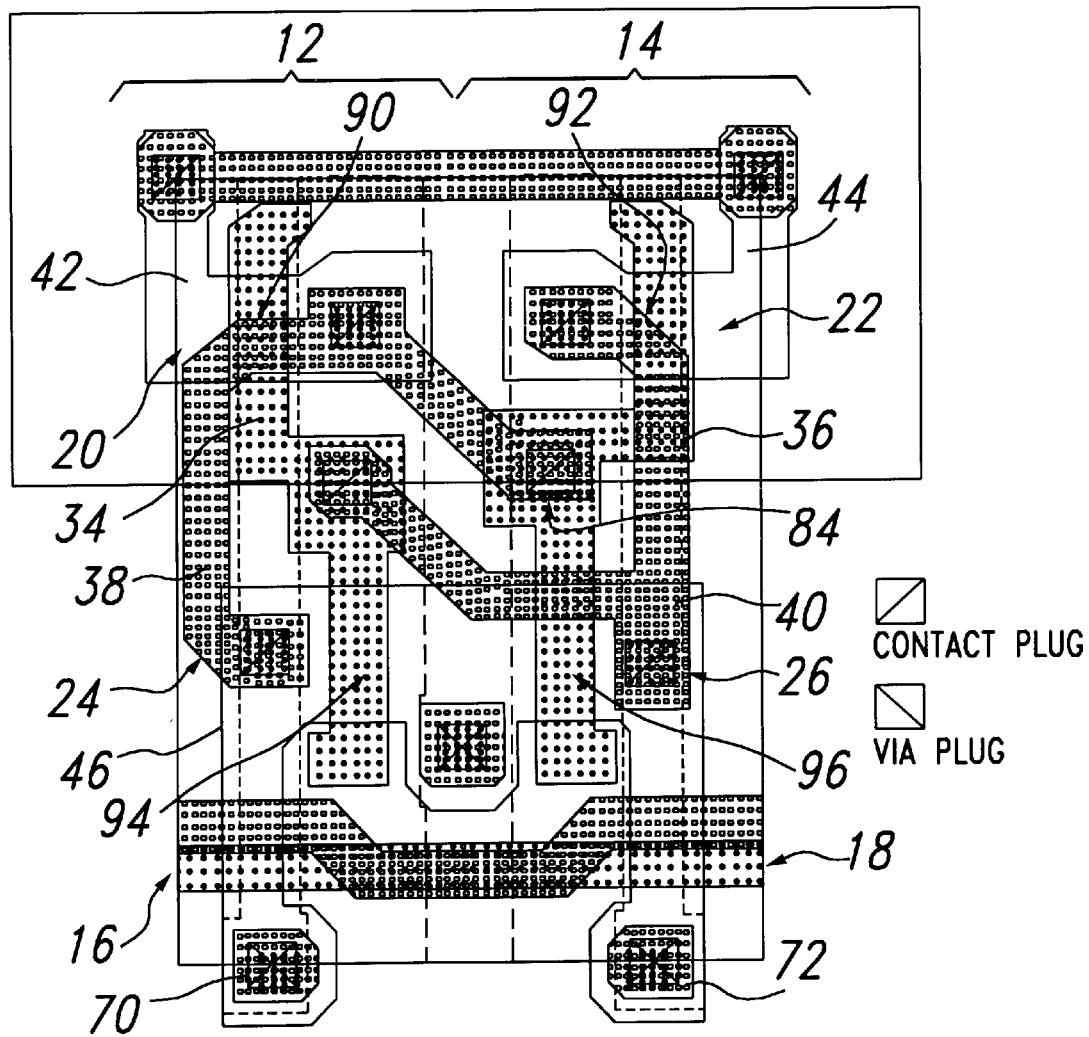
Figure 3:
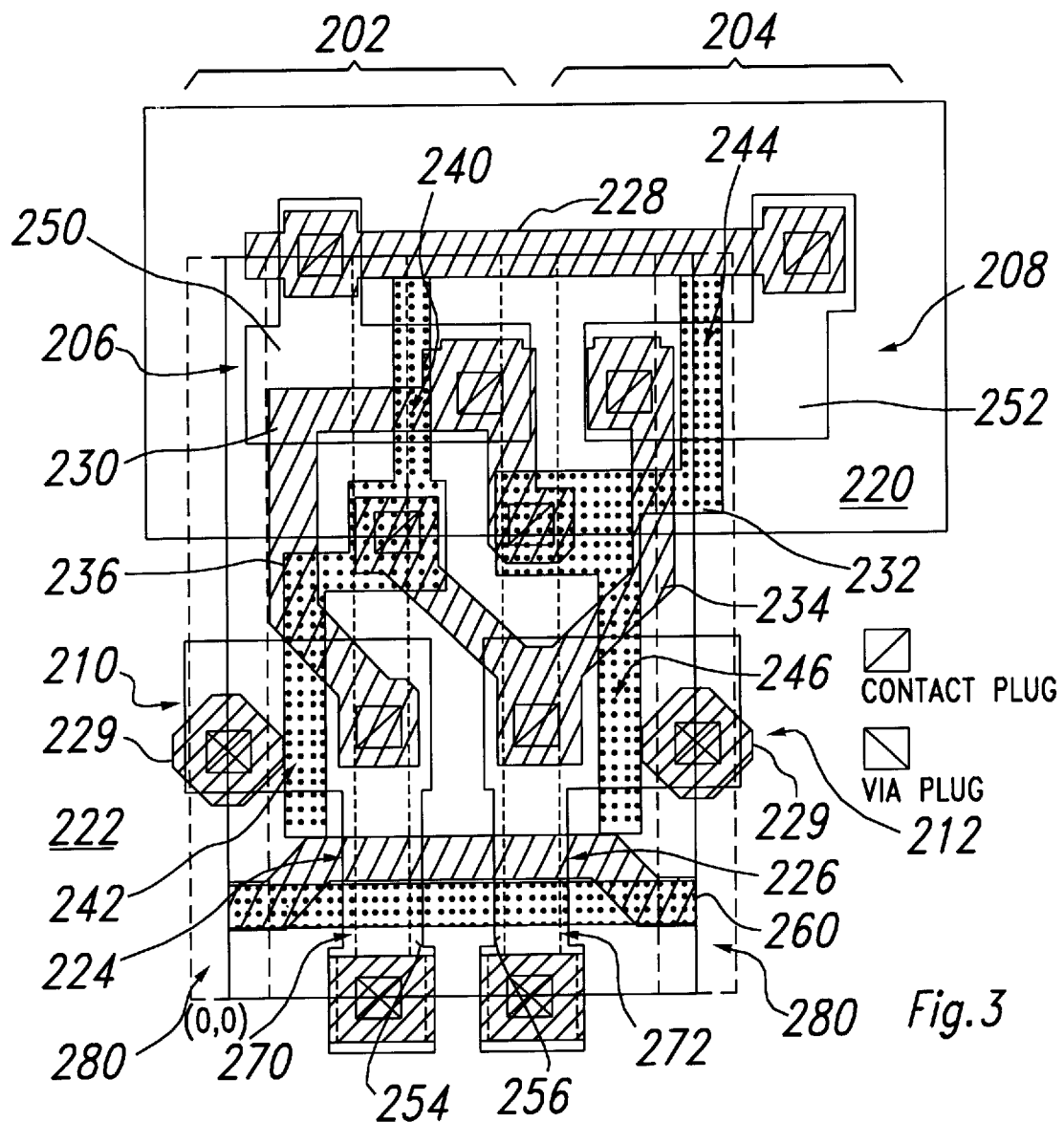
FIG. 3 is a layout diagram of a SRAM cell according to a second embodiment of the invention.

A 6T CMOS SRAM cell layout according to a second embodiment of the invention is shown in FIG. 3. The layout of FIG. 3 also corresponds to the schematic diagram of FIG. 1. P-channel transistors 206 and 208 are located within n-well 220. N-channel transistors 210 and 212 are formed outside of n-well 220 in substrate 222. Pass transistors 224 and 226 are also located in substrate 222. If a n-type substrate is alternatively used, the p-channel transistors 206 and 208 may be formed in the substrate and the n-channel transistors 210 and 212 as well as pass transistors 224 and 226 may be formed in a p-well (not shown).

P-channel transistors 206 and 208 are pull-up transistors and are connected to the supply voltage, Vcc 228. N-channel transistors 210 and 212 are connected between the respective p-channel transistor and ground 229. N-channel transistors 210 and 212 are thus pull-down transistors. P-channel transistor 206 and n-channel transistor 210 form inverter 202. P-channel transistor 208 and n-channel transistor 212 form inverter 204. Inverters 202 and 204 are connected in a cross-coupled fashion in that the output 230 of inverter 202 is connected to the input 232 of inverter 204 and the output 234 of inverter 204 is connected to the input 236 of inverter 202.

The layout shown in FIG. 3 is also a low aspect ratio layout The aspect ratio is less than 2:1. In the low aspect ratio layout of FIG. 3, the n-channel transistors 210 and 212 are roughly aligned laterally as is typical in a low aspect ratio layout. The p-channel transistors 206 and 208 are also roughly aligned laterally.

The transistor gate 240 of p-channel transistor 206 is offset both vertically and horizontally from the transistor gate 242 of n-channel transistor 210. The transistor gate 244 of p-channel transistor 208 is offset both vertically and horizontally from the transistor gate 246 of n-channel transistor 212. The p-channel transistor gates 240 and 244 are both offset in the same direction from the n-channel transistor gates 242 and 246, respectively. P-channel transistor gates 240 and 244 are offset to the right horizontally from n-channel transistor gates 242 and 246, respectively in the embodiment of FIG. 3. Those skilled in the art will realize that they may alternatively be offset to the left horizontally. The amount of offset may differ between the inverters 202, 204. FIG. 3 shows a larger offset horizontally in inverter 202 than in inverter 204.

In contrast to prior art SRAM cells, the mean co-ordinate in the x-direction, xnm, of the n-channel transistor gates 242 and 246 is not equal to the mean co-ordinate in the x-direction, xpm, of the p-channel transistor gates 240, 244. That is, if the x-y co-ordinate of the center point of gate 242 is xn1,yn1, the x-y co-ordinate of the center point of gate 246 is xn2,yn2, the x-y co-ordinate of the center point of gate 240 is xp1,yp1, and the x-y co-ordinate of the center point of gate 244 is xp2,yp2, the mean (xnm=(xn1+xn2)/2) of the x co-ordinates of the n-channel transistors is not equal to the mean (xpm=(xp1+xp2)/2) of the x co-ordinates of the p-channel transistors. A difference between the p-channel mean xpm and the n-channel mean xnm may be in the range of the minimum feature size of a given technology (e.g., 0.5 microns) to one half of the cell width. For example, in FIG. 3, the cell width is 7.4 microns, xn1 is 0.90 microns, xn2 is 5.9 microns, xp1 is 2.65 microns and xp2 is 7.25 microns. Thus, xnm is 3.40 and xpm is 4.95 for a difference of 1.55 microns. The cell origin is marked as (0,0).

The fabrication process for the second embodiment is also conventional. Moat regions 250–256 are formed first. The polysilicon gate electrodes 236, 232, and 260 are formed next. The desired source/drain regions are then formed in moat regions 250–256. P-type source/drain regions are formed in moat regions 250–252 and n-type source/drain regions are formed in moat regions 254–256. Finally, metal interconnect layers are formed to provide the desired interconnects. Only the first metal layer is shown in FIG. 3. Subsequent metal layers may be used to route ground, Vss 180, and the bitlines (270, 272)

The second embodiment of the invention also utilizes the advantages of offsetting p-channel and n-channel transistors. A smaller cell area and/or improved process margins can be obtained. This is due to reduced impact of the metal overlap of contact design rule on cell size.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, as technology improves (i.e., to 0.35 μm, 0.25 μm, and smaller technologies), the invention may be applied to these technologies. The SRAM cells of FIGS. 2 and 3 may be shrunk to fit the new design rules and technologies. It is therefore intended that the appended claims encompass any such modifications or embodiments.

What is claimed is:

1. A static random access memory (SRAM) cell comprising:
    a first inverter comprising a first p-channel transistor and a first n-channel transistor, said first p-channel transistor being offset in both the horizontal and vertical directions from said first n-channel transistor;
    a second inverter cross-coupled with said first inverter and comprising a second p-channel transistor and a second n-channel transistor, said second p-channel transistor being offset from the second n-channel transistor in the same horizontal and vertical directions as the first p-channel and first n-channel transistors, and with said first and second n-channel transistors horizontally aligned.

2. The SRAM cell of claim 1, wherein said first p-channel transistor is offset from said first n-channel transistor in the horizontal direction a distance equal to an offset in the horizontal direction of said second p-channel transistors from said second n-channel transistor.

3. The SRAM cell of claim 1, wherein said first p-channel transistor is offset from said first n-channel transistor in the vertical direction a distance equal to an offset in the vertical direction of said second p-channel transistors from said second n-channel transistor.

4. The SRAM cell of claim 3, further comprising a pair of pass transistors connected to said first and second inverters.

5. The SRAM cell of claim 3, wherein the gates of said n-channel pull-down transistors are laterally aligned.

* * * * *